United States Patent [19]

Yamakawa

[11] Patent Number: 4,862,166
[45] Date of Patent: Aug. 29, 1989

[54] COMBINATION KEYBOARD INCLUDING PLURAL STROKE KEYS AND PLURAL TOUCH KEYS

[75] Inventor: Kiyoshi Yamakawa, Hashima-gun, Japan

[73] Assignee: Brother Kogyo Kabushiki Kaisha, Aichi, Japan

[21] Appl. No.: 104,273

[22] Filed: Oct. 5, 1987

[30] Foreign Application Priority Data

Oct. 6, 1986 [JP] Japan .................................. 61-237712
Oct. 6, 1986 [JP] Japan .................................. 61-237713

[51] Int. Cl.⁴ .............................................. G06F 3/02
[52] U.S. Cl. ........................................ 341/22; 341/23; 341/33; 341/34
[58] Field of Search ........... 340/365 R, 365 C, 365 A, 340/365 S, 365 VL; 200/159 B, 292; 341/20, 22, 23, 26, 33, 34

[56] References Cited

U.S. PATENT DOCUMENTS

| 3,627,927 | 12/1971 | Schmitz | 340/365 A |
| 3,911,234 | 10/1975 | Kotaka | 200/292 |
| 4,328,441 | 5/1982 | Kroeger, Jr. et al. | 340/365 A |
| 4,367,385 | 1/1983 | Frame | 200/292 |
| 4,414,538 | 11/1983 | Schnizlein | 340/365 C |
| 4,523,060 | 6/1985 | Maguire | 200/292 |
| 4,556,871 | 12/1985 | Yoshikawa et al. | 340/365 C |
| 4,640,994 | 2/1987 | Komaki | 200/159 B |

*Primary Examiner*—David K. Moore
*Assistant Examiner*—M. Fatahaiya
*Attorney, Agent, or Firm*—Barnes & Thornburg

[57] ABSTRACT

Disclosed is an input device or keyboard for inputting into an electronic appliance, comprising stroke keys and touch keys disposed on a common circuit matrix of a flexible printed circuit board. Preferably, data inputting keys such as character keys are composed of stroke keys and function keys for inputting command signals are composed of touch keys. In order to judge precisely ON/OFF actions of stroke keys and touch keys, key scanning control applied commonly to these keys is provided.

8 Claims, 10 Drawing Sheets

COMBINATION KEYBOARD INCLUDING PLURAL STROKE KEYS AND PLURAL TOUCH KEYS

BACKGROUND OF THE INVENTION

The present invention relates to an input device of electronic appliances such as typewriter, word processor and personal computer, and more particularly to an input device having plural stroke keys and plural touch keys mounted on a common FPC board.

Conventionally, in the input devices of electronic appliances such as typewriter, personal computer and word processor, generally stroke keys which possess a tactile feed back effect, excel in controllability and rarely malfunction are used.

For example, the Japanese Patent Publication (non-examined) No. 58-181213 discloses stroke keys which are designed so that the key tops of the stroke keys may be detached from the keyboard main body and exchanged with other key tops differing in size.

In this kind of input device, in order to lower the manufacturing cost, stroke keys are disposed, corresponding to each contact point of the electric contact matrix of a flexible printed circuit board (FPC board) generally.

Then by the key scan control executed by the control unit of the input device, the operated key is discriminated and the ON action and OFF action are judged.

On the other hand, in the keyboard of an input device of pocket calculator and card type computer, small and inexpensive touch keys are used.

For example, the Japanese Patent Publication (non-examined) No. 58-10325 discloses an input device composed of multiple character keys disposed in a character display region and multiple function keys disposed in a function display region, which comprises touch keys designed to obtain a large operation reaction by the reinforcing plate assembled in a flexible switch cover of the function keys in the function display region because a sufficient operating reaction cannot be obtained in function keys which are larger than character keys.

In the case of an input device of an electronic appliance, in order to discriminate the operated key and judge the ON action and OFF action, key scan control is executed in a control unit, and to prevent complication of the key scan control, in the conventional input device, either stroke keys or touch keys are used.

Recently, as the functions are rapidly sophisticated in the electronic typewriter, word processor and other electronic appliances, the number of keys in the input device tends to increase, but when the stroke keys are increased, the keyboard becomes larger in size, the manufacturing cost becomes very high.

It is undesirable to use the small and inexpensive touch keys to entirely replace the stroke keys, since for the tough keys, the pressing stroke is very small and sufficient tactile feedback cannot be obtained, and the controllability is poor. Besides, when used for a long time, fatigue of fingertips is significant, and malfunction by chattering is likely to occur because of operation by soft fingertips so that a longer time may be required to judge the ON action and OFF action in key scan control, which results in reduction of the key operation speed.

It is hence a primary object of this invention to present an input device comprising stroke keys and touch keys, possessing the advantages of both stroke keys and touch keys. It is a secondary object of this invention to present an input device capable of performing key scan control without sacrificing the characteristics of both stroke keys and touch keys. And it is a tertiary object of this invention to present an input device comprising stroke keys and touch key which is not lowered in the controllability.

SUMMARY OF THE INVENTION

The input device according to the present first invention comprises a flexible printed circuit (FPC) board having a common circuit matrix comprising plural columns and plural rows of electric contacts, and plural stroke keys and plural touch keys disposed on the common circuit matrix of the FPC board. Preferably, the input device further comprises key scan control means for key scanning while delivering scan signals in each row or each column of the circuit matrix, first counting means for counting the results of key scanning effected by the key scan control means in a first mode for each stroke key, second counting means for counting the results of key scanning effected by the key scan control means in a second mode for each touch key, first judging means for judging the ON action when reaching a specified count number upon depression of a stroke key on the basis of the counting result of the first counting means, and second judging means for judging the ON action when reaching a specified count number greater than above-mentioned specified number upon depression of a touch key on the basis of the counting result of the second counting means.

The input device according to the present second invention comprises a plurality of character keys for inputting characters and symbols, and a plurality of function keys for commanding various functions, and further comprises a flexible printed circuit (FPC) board including an electric contact matrix of the input device, a plurality of stroke keys assembled corresponding to some of the electric contacts of the FPC board, and a plurality of touch keys disposed corresponding to the electric contacts of the FPC board other than the stroke key electrical contacts.

In the input device of the present first invention, the plurality of stroke keys and the plurality of touch keys are disposed on the FPC board which comprise plural columns and plural rows of electric contacts, and the keys are scanned by the key scan control means while delivering scan signals in each row or each line of the circuit matrix.

The first counting means counts the results of key scanning effected by the key scan control means in a specified first mode for each stroke key, while the second counting means counts the results of key scanning effected by the key scan control means in a specified second mode for each touch key.

The first judging means judges the ON action when reaching a specified count value upon depression of a stroke key on the basis of the counting result of the first counting means, while the second judging means judges the ON action when reaching a specified count value upon depression of a touch key on the basis of the counting result of the second counting means.

According to the input device of the present invention, thus, since plural stroke keys and plural touch keys are disposed on the circuit matrix of a common FPC board, the input device possesses the advantages of stroke keys including the excellent controllability, few malfunctions and high speed operation, and the advantages of touch keys which are small and expensive.

Because of judgement of ON action depending on the stroke key and touch key while controlling the key scan by a common scan signal for plural stroke key and plural touch keys, the key scan control can be effected without sacrificing the characteristics of both stroke keys and touch keys.

When character keys are composed of stroke keys and function keys are made of touch keys, the demand for extension of function keys may be met while keeping the controllability and rapidity of operation of the character keys. Furthermore, when the operating surface of stroke keys and that of touch keys are formed on a nearly same plane, the appearance of the keyboard is not spoiled, and the key operation is convenient.

BRIEF DESCRIPTION OF THE DRAWINGS

The drawings illustrate the input device according to embodiments of the present invention, in which:

FIGS. 9 (a), 9 (b) and 9 (c) are a flow chart of key input processing in the routine shown in FIG. 8.

DESCRIPTION OF THE PREFERRED EMBODIMENTS

Referring now to the drawings, the preferred embodiment applied the input device of the present invention into an electronic typewriter is described below.

Figure 1:
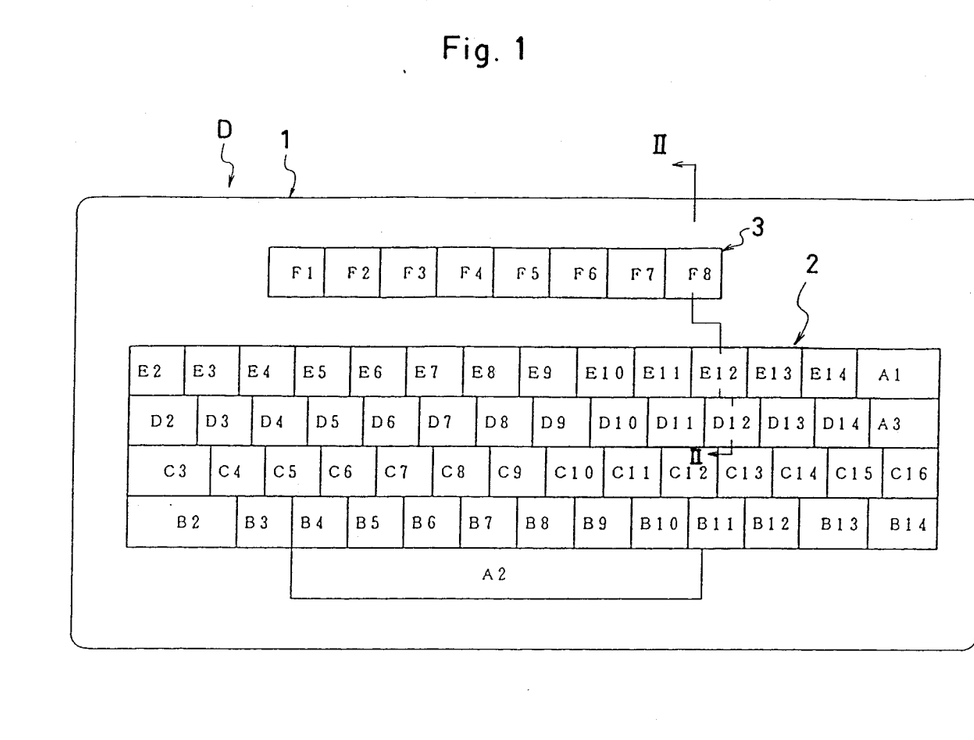
FIG. 1 is a plan view of an input device.
Figure 2:
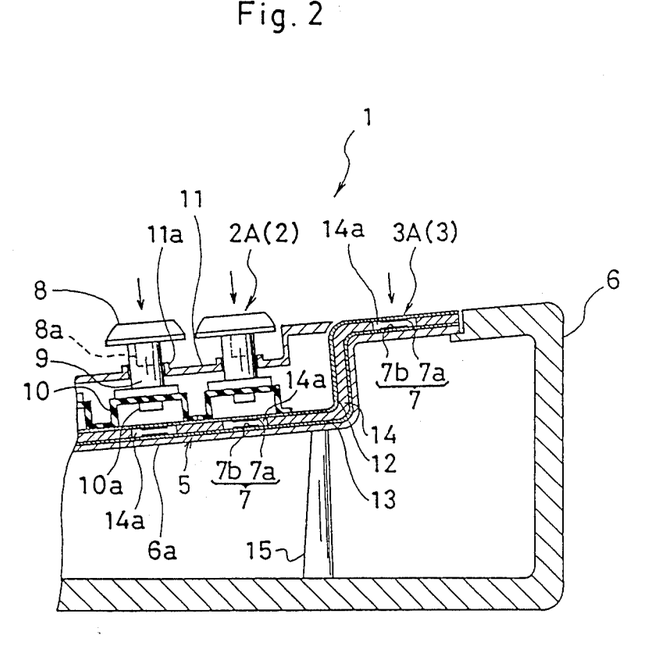
FIG. 2 is a sectional view of II—II line in FIG. 1.

A keyboard 1 of this input device D comprises, as shown in FIG. 1 and FIG. 2, multiple character keys 2 (alphabet keys, numeric keys, symbol keys, space key, etc.), and multiple function keys 3 (repeat key, margin set key, tab set key, indent key, relocation key, etc.).

Since character keys 2 are high in the frequency of use, they are composed of stroke keys 2A which are excellent in operation and few in malfunctions, while function keys 3 which are relatively less frequently used are composed of touch keys 3A, and the operating surface of stroke keys 2A and that of touch keys 3A are formed nearly on a same plane.

In the actual keyboard 1, meanwhile, characters and symbols are marked on the top of character keys 2, and function names are shown on the top of function keys 3, but in the illustrations, for the convenience of explanation to follow, the code date generated at the time of operation of each key is shown as shown in FIG. 1. The character keys 2 are expressed with code data of A1 to A3, B2 to B14, C3 to C16, D2 to D14, E2 to E14, and the function keys 3 are identified with code data of F1 to F8.

Multiple character keys 2 and multiple function keys 3 are assembled in a common FPC board 5 (flexible printed circuit board) possessing a circuit matrix 4 (see FIG. 4) containing, in the case of this embodiment, 8 columns and 8 rows of electric contacts, and it is designed that the keys are scanned by a common scan signal delivered from a control unit C which is described below, thereby effecting the key input processing control.

As shown in FIG. 2, of a case 6 of the keyboard 1, the part in which said character keys 2 are disposed is formed one step lower than the other parts, and the FPC board 5 is mounted in a folded like a crank as seen from side by this stepped part for character keys 2 and the disposing part for function keys 3 behind it, and each character key 2 and each function key 3 are provided so as to correspond to each electric contact 7 of this FPC board 5.

A stroke key 2A to make up character keys 2 is basically composed of a key top 8, a key stem 9 for mounting this key top 8, and a rubber contact plate 10 for supporting this key stem 9 in a manner free to move vertically.

Key stem 9 is cylindrical, and the shaft part 8a of the key top 8 is fitted in this cylinder so that the key top 8 may be freely attached or detached. The contact plate 10 is shaped like a cap, and on its upper part, the key stem 9 is fixed with adhesive, and a projection 10a to press the electric contact 7 is formed in the lower surface of the top of the contact plate 10. Said key stem 9 inserted through a cylindrical guide part 11a formed in a guide plate 11, is guided freely to move vertically by this guide part 11a.

When the key top 8 is pressed down by finger, the key top 8 and key stem 9 are pushed down, and the contact plate 10 is elastically deformed, and presses down the electric contact 7 by its projection 10a. When the key top 8 is relieved of the finger, the key stem 9 and key top 8 move upward to return to the original position by the restoring force of the contact plate 10, and the projection 10a of the contact plate 10 is departed from the electric contact 7, so that the electric contact 7 is released. A touch key 3A to make up function keys 3 is disposed without any particular intervening member than the membrane member provided for marking the function name on the surface of the FPC board 5, at the location of the electric contact 7 of the FPC board 5. The FPC board 5 for composing the circuit matrix 4 of said keyboard 1 is described below. The FPC board 5 is, as shown in FIG. 2, built in a three-layer structure consisting of an upper plastic film (called upper film hereinafter) 12 and a lower plastic film (lower film 13) possessing a proper flexibility and elasticity, and a spacer 14 made of an insulator placed between the upper film and lower film 12, 13, and beneath this FPC board 5, a reinforcing plate 6a made of an insulator which is part of a case 6 is provided so that the FPC board 5 may not be deflected downward, so as to be supported by plural bases 15.

Figure 3:
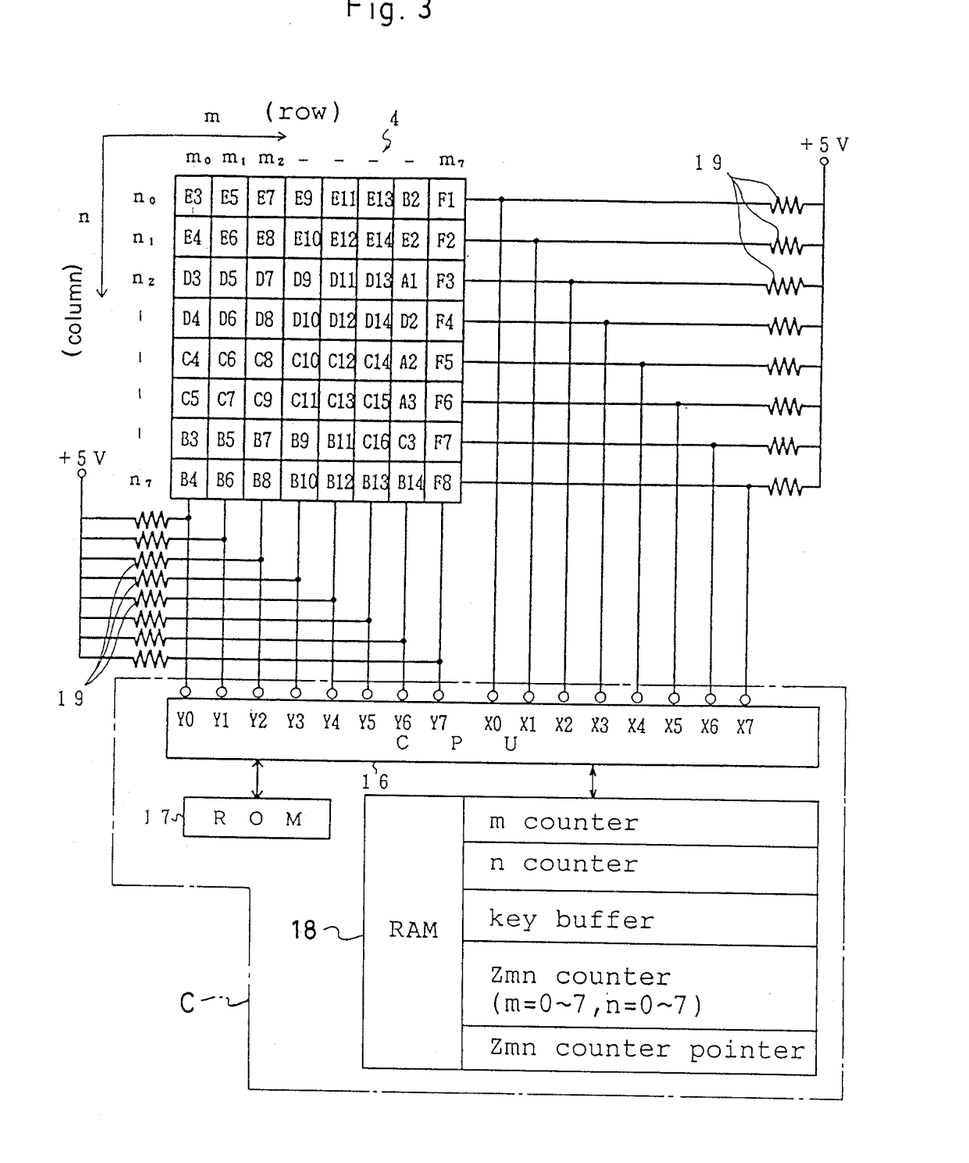
FIG. 3 is a structural drawing of circuit matrix and control unit of the input device shown in FIG. 1.
Figure 4:
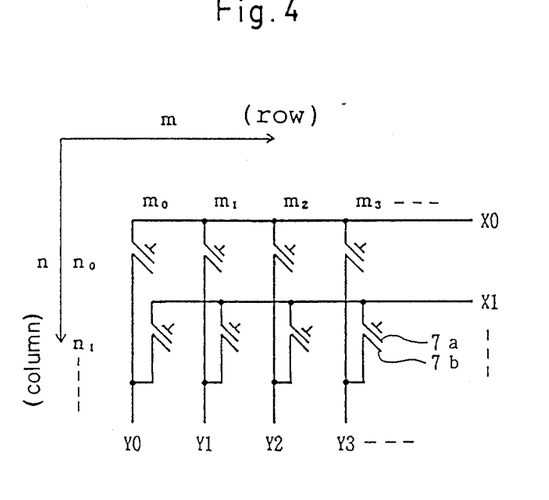
FIG. 4 is a circuit diagram schematically expressing part of the circuit matrix shown in FIG. 3.

As shown in FIG. 2 to FIG. 4, at positions corresponding to said character keys 2 and function keys 3, circular holes 14a are formed in the spacer 14 of the FPC board 5, and at the locations of these circular holes 14a, electric contacts 7 are formed by the upper electrodes 7a on the lower surface of the upper film 12 and the lower electrodes 7b on the upper surface of the lower film 13, and these 64 electric contacts 7 are composed in a printed circuit so as to make up a circuit matrix 4 of 8 columns and 8 rows.

On the other hand, the control unit C of the input device D is, as shown in FIG. 3, composed of CPU 16 (central processing unit), ROM 17 (read only memory), and RAM 18 (random access memory), and the lower electrodes 7b in rows m0 to m7 of the circuit matrix 4 of said keyboard 1 are connected to the corresponding output terminals Y0 to Y7 of the CPU 16, while the upper electrodes 7a in columns n0 to n7 are connected to the corresponding input terminals X0 to X7 of the CPU 16. Similarly, the lower electrodes 7b in rows m0 to m7 and the upper electrodes 7a in columns n0 to n7 are respectively connected to the reference voltage lines by way of pull-up resistances 19.

FIG. 4 is a schematic diagram of part of the circuit matrix 4, in which when one of the keys is operated to ON position, the input terminals X0 to X7 of the corresponding row and the output terminals Y0 to Y7 of the corresponding column are made to conduct.

In said FPC board 5, basically, the upper electrodes 7a are continuously formed in printed circuit on the under surface of the upper film 12 so as to correspond to the key layout, and the lower electrodes 7b are continuously formed in printed circuit on the top surface the lower film 13, and each electric contact 7 is formed at the intersection of the upper electrodes 7a and lower electrodes 7b, but by partly deleting or adding the circuit of the upper electrodes 7a and lower electrodes 7b, the circuit matrix 4 of 8 columns and 8 rows is constituted.

The ROM 17 of said control unit C comprises preliminarily stores a control program of key input processing control including a key scan control for detecting scan signals sequentially in each column of each row while delivering scan signal of L level sequentially in each row of the circuit matrix 4 of the keyboard 1, and including a judging control for judging the key ON action and OFF action while cooperating with the key scan control, and a code data table for converting the position information on the circuit matrix 4 of each key into code data. Said RAM 18 comprises m counters for sequentially storing the row information of m0 to m7 depending on the key scan, n counters for sequentially storing the column information of n0 to n7 depending on the key scan, 64 Zmn counters corresponding to 64 keys (m=0 to 7, n=0 to 7), Zmn counter pointer for sequentially indicating the Zmn counters corresponding to the key scan, a key buffer composed of FIFO memory (first in, first out memory) of stack structure for storing the code data of the operated stroke keys A or touch keys 3A, and various memories for temporarily storing the results of processing operation in CPU 28.

Figure 5:
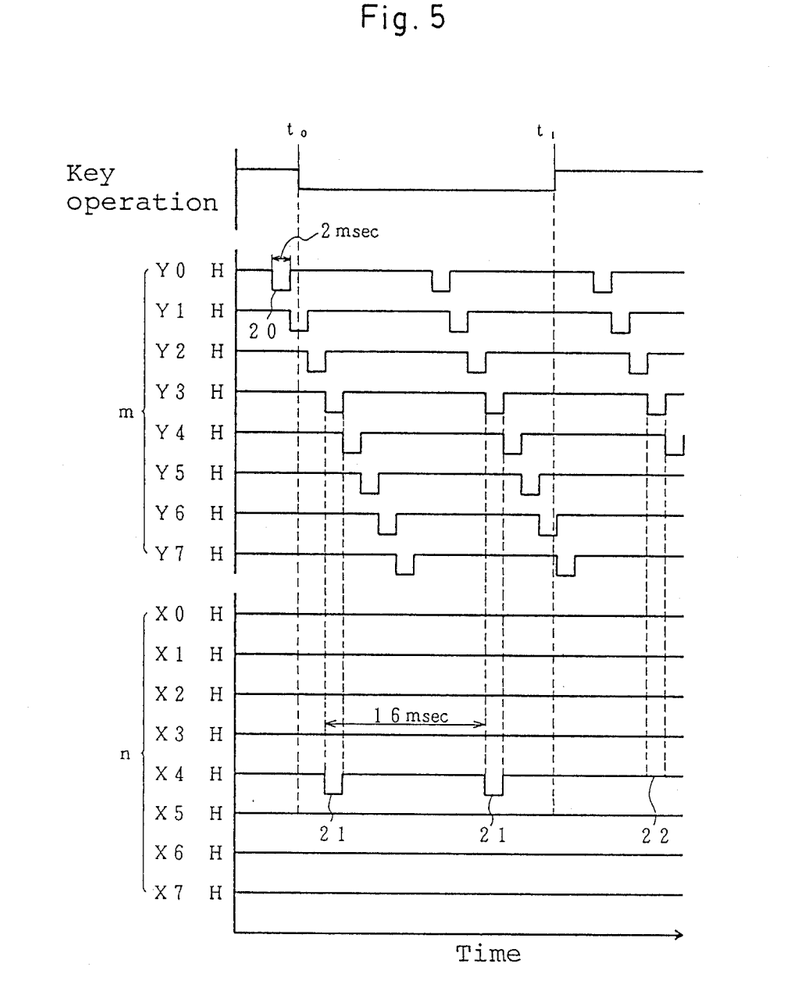
FIG. 5 is an operation time chart of key scan control.

Said key scan control is same as that done in an ordinary input device, and is hence briefly explained by referring to FIG. 5. While L level scan signals 20 of 2 msec are delivered sequentially from the output terminals Y0 to Y7 of the CPU 16 and scan signals are delivered to the output terminals Y0 to Y7, the key scan for feeding signals sequentially from the input terminals X0 to X7 at every small interval of, for example, 2 msec is executed in a period of 16 msec, and the ON action signal 21 and OFF action signal 22 of each key are detected.

For example, when the stroke key 2A of (m3, n4) is operated in ON position from t0 to t1, as shown in the diagram, two L level ON action signals 21 are continuously detected at input terminal X4. However, as understood from the explanation of the flow chart below, the scan signal 20 is composed of eight L level signals, and the ON action signal 21 and OFF action signal 22 are 2 msec signals.

Incidentally, in the case of stroke key 2A, since chattering in key operation is less, it is all right when it is designed to judge the ON action when two or more ON action signals 21 are detected, that is, when the stroke key 2A is pressed down for at least 16 msec.

In the case of touch key 3A, however, since the key is directly operated by a soft fingertip, chattering is likely to occur, and it is necessary to design to judge the ON action when three ON action signals 21 are detected, more than in the case of stroke key 2A, that is, when the touch key 3A is pressed down for at least 32 msec. This is the same when judging the OFF action.

In the input device D of the present invention, while executing the common key scan control by incorporating the stroke keys 2A and the touch keys 3A into the common matrix circuit 4, the ON action and OFF action are judged according to the characteristics of the stroke key 2A and the touch key 3A by the key input processing control.

The key input processing control is described below while relating to the flow charts in FIG. 8 and FIG. 9, but prior to this explanation, the operation of the Zmn counters is illustrated according to FIG. 6 and FIG. 7 for the ease of understanding of the flow chart.

Figure 6:
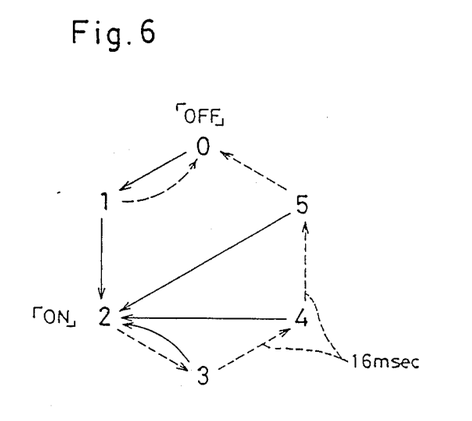
FIG. 6 is an operation explanatory diagram of Zmn counter for the stroke key.
Figure 7:
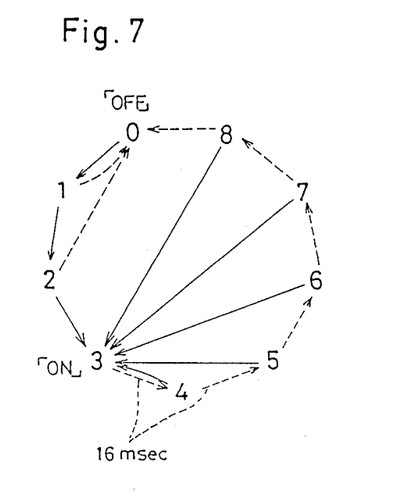
FIG. 7 is an operation explanatory diagram of Zmn counter for the touch key.

FIG. 6 shows the operation of Zmn counter of stroke key 2A, and FIG. 7 denotes the operation of Zmn counter of touch key 3A, in which numerals refer to the content of Zmn counters, the solid-line arrow indicates the operation when detected ON action signal 21, and the broken-line arrow relates to the operation when detected OFF action signal 22 (the H level signal detected at every timing of key scan).

In the Zmn counter of stroke key 2A, supposing the content (value) of the counter is CNT, while the OFF state continues, CNT is 0, and a first ON action signal 21 is detected, CNT becomes 1, and when a second ON action signal 21 is detected successively, CNT becomes 2. At CNT=2, it is regarded that the key is operated in ON action, and the code data of the corresponding key is written into the key buffer. Furthermore, if the ON action signal 21 is continuously detected third time, fourth time, or fifth time, the CNT is not counted up but is kept at 2, but when the OFF action signal 22 is detected continuously in the state of CNT=2, the CNT is counted up every time, and when the fourth OFF action signal is detected (after the lapse of 4×16 msec from the moment of CNT=2), CNT=5 is changed over to CNT=0, and when becoming CNT=0, it is regarded that the key is operated in OFF action, and the OFF information of the corresponding key is written into the key buffer.

Incidentally, after the detection of the first ON action signal 21, if a second ON action signal 21 is not detected successively, CNT=1 is changed over to CNT=0, or if an ON action signal 21 is detected while CNT=3, 4, or 5, it is changed over to CNT=2. Thus, the Zmn counter of FIG. 6 operates in a first mode as a hexadic counter.

In the case of the Zmn counter of said touch key 3A, too, the operation is the same as in the Zmn counter above, except that the time for judging the ON action and OFF action is set longer than that of the Zmn counter of stroke key 2A. That is, only when first, second and third ON action signals 21 are detected consecutively, CNT becomes 3, when the key is regarded to be operated in ON action, and the code data of the corresponding key is written in. Furthermore, in succession, when fourth to eighth ON action signals 21 are detected, the CNT is not counted up but is kept at CNT=3, but when the OFF action signals 22 are detected continuously in the state of CNT=3, the CNT is counted up every time, and when the sixth OFF action signal 22 is counted up (when 6×16 msec has passed since CNT=3), CNT=8 is changed over to CNT=0, when the key is regarded to be operated in OFF action, and the OFF information of the corresponding key is written into the key buffer.

That is, when an OFF action signal 22 is detected while CNT=1 or 2, it is changed over to CNT=0, and when an ON action signal 21 is detected while CNT=4, 5, 6, 7, or 8, it is changed over to CNT=3. Thus, the Zmn counter of FIG. 7 operates in a second mode as an enneadic counter.

Figure 8:
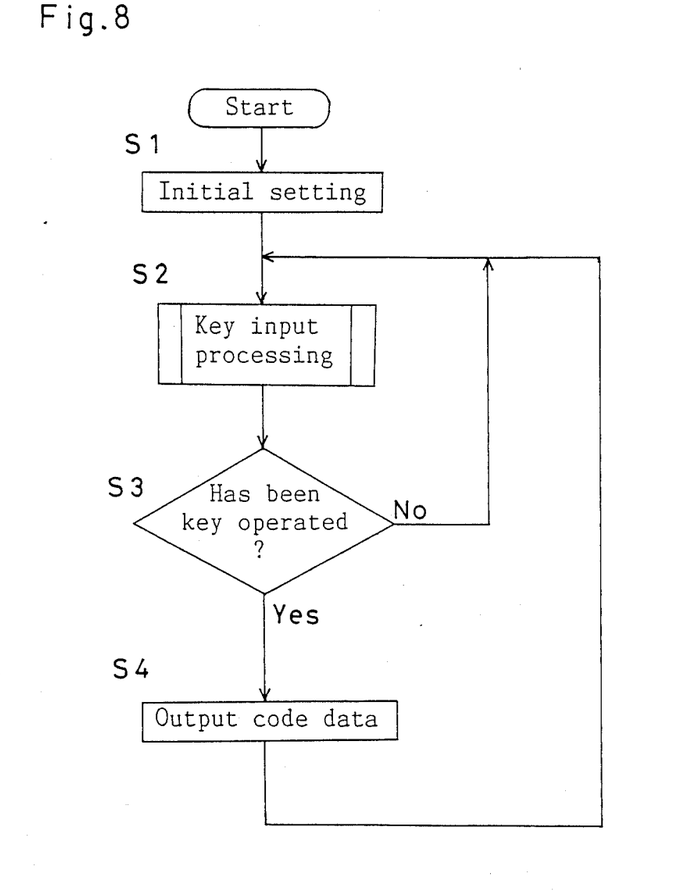
FIG. 8 is a flow chart of key input processing control routine.
Figure 9:
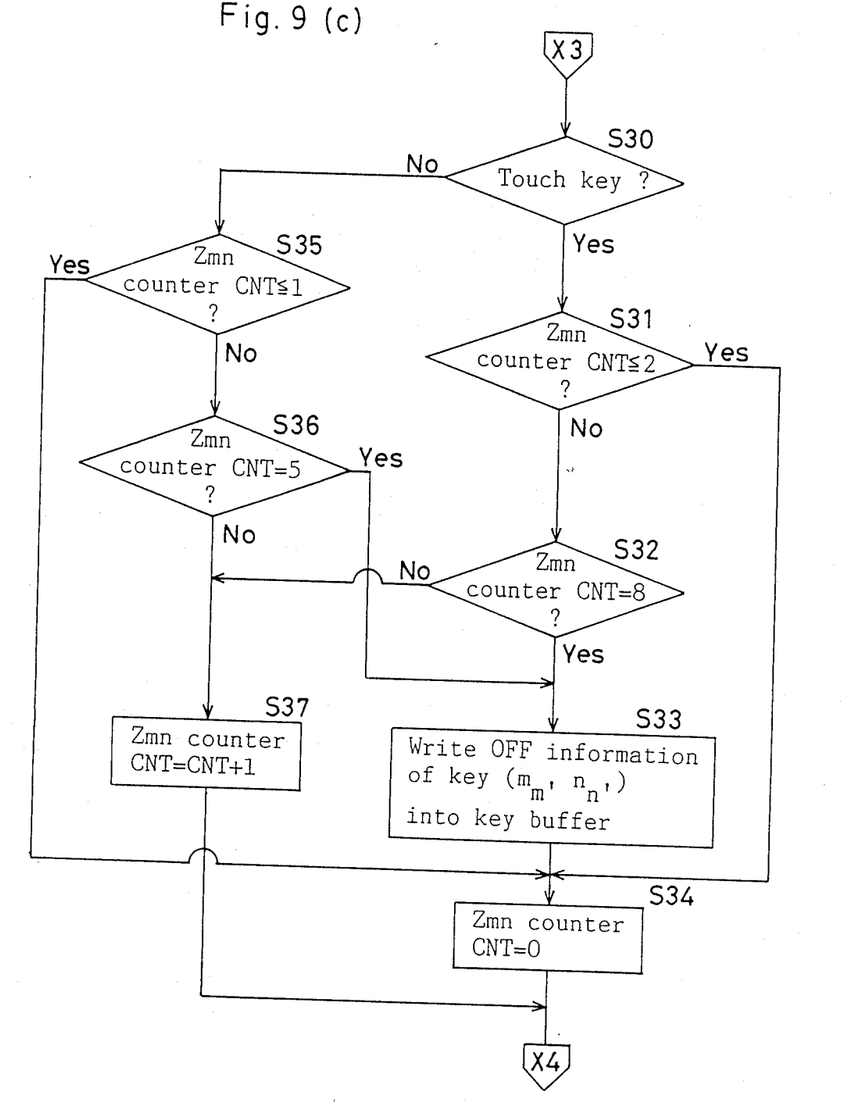

Next is explained the routine of the key input processing control carried out in the control unit C while referring to the flow charts in FIG. 8 and FIG. 9.

As shown in FIG. 8, when the power is supplied into the input device, this control is started, and at step S1 (hereinafter expressed as S1 so are other steps), each memory of RAM 18 is cleared, and the value m of m counter is cleared to zero, and other initial settings are effected. At the next S2, the key input processing mentioned below is effected, and the code data corresponding to the operated key is written into the key buffer.

Subsequently, at S3, based on the data of the key buffer, whether a key is input or not, that is, whether a key is operated or not is judged, and the operation returns to S2 if key is not operated, and proceed to S4 if operated.

At S4, the code date written in the key buffer is delivered to the control device of the typewriter, and the operation returns to S2. Meanwhile, steps S2 to S4 are operated, for example, every 2 msec.

Figure 9A:
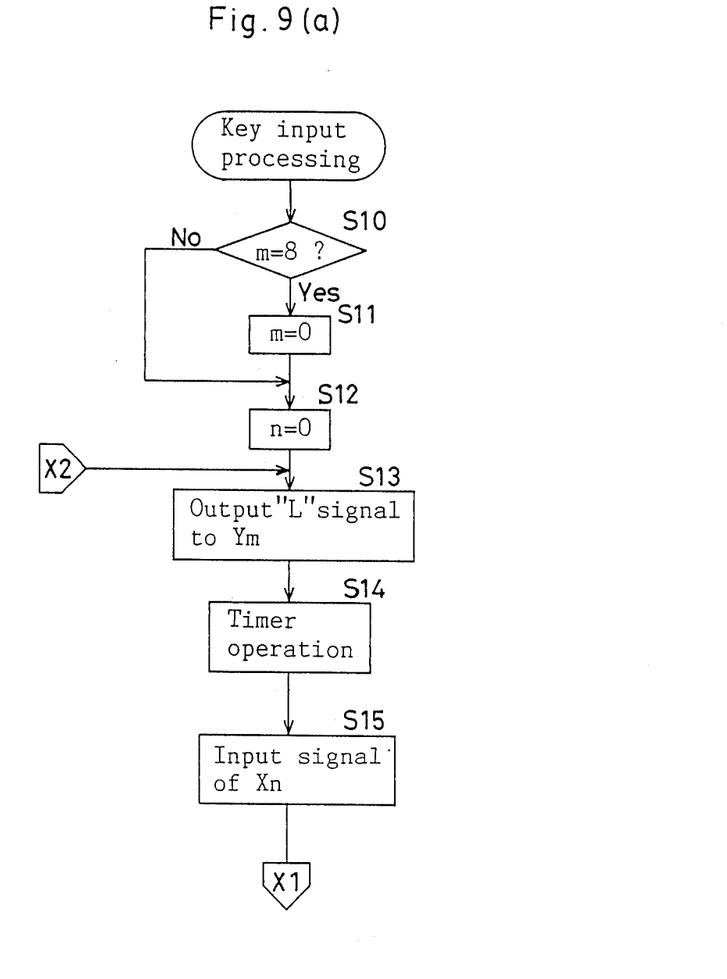
Figure 9B:
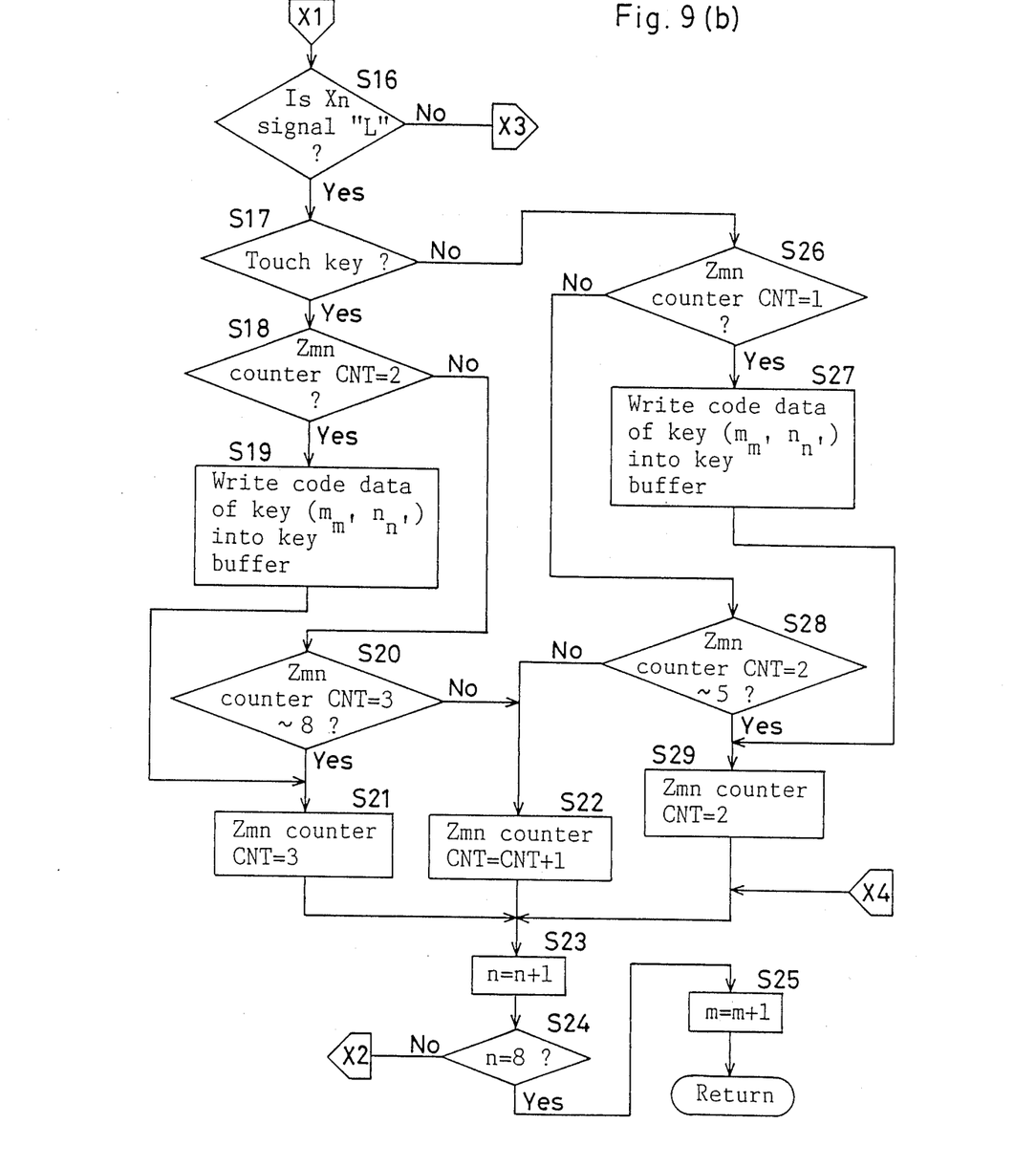

The key input processing at S2 is described below while referring to FIG. 9 (a), 9 (b) and 9 (c). In the diagram, "m" denotes the content of m counter, "n" that of n counter, and "CNT" that of Zmn counter.

First at S10, whether the value m of m counter of RAM 18 is m=8 or not is judged, and the operation proceeds to S11 when m=8, and to S12 when not. At S11, the value m of m counter is set at m=0. At the next S12, the value n of n counter is set at n=0, and (m, n) is written in the Zmn counter pointer, and the Zmn counter is indicated. Then, at S13, a scan signal of L level is delivered from output terminal Ym (m=0 to 7). At S14, the timer is put in action to wait for the expiration of a specified time (for example, 100 to 200 msec) until the scan signal from the output terminal Ym is stabilized. At S15, the signal of input terminal Xn (n=0 to 7) is entered.

At S16, whether the signal of input terminal xn input at S15 is L level or not, that is, whether the key corresponding to terminals Ym, Xn has been operated or not is judged, and the operation proceeds to S17 when L level signal (ON action signal 21) is detected, and to S30 if H level signal (OFF action signal 22).

At S17, based on the circuit matrix 4 and key layout, whether the operated key is a touch key 3A or not is judged, and the operation proceeds to S18 if it is touch key 3A, and to S26 if stroke key 2A.

At S18, based on the data of Zmn counter pointer, whether the value CNT of Zmn counter is CNT=2 or not is judged, and the operation proceeds to S19 if CNT=2, and to S20 if not CNT=2.

At S19, the code data corresponding to the operated key ($m_m$, $n_n$) is read out from the code data table of ROM 17, and the code data is written into the key buffer, and the operation proceeds to S21.

At S20, whether value CNT of Zmn counter is CNT=3 to 8 is or not is judged, and the operation proceeds to S21 if yes, and the value CNT of Zmn counter is set in CNT=3, and the operation proceeds to S23. If no, that is, if CNT= 0 or 1, at S22, 1 is added to the value CNT of Zmn counter, and the operation proceeds to S23.

At the next S23, 1 is added to the value n of n counter. At S24, whether the value n of n counter is n=8 or not is judged, and the operation returns to S18 if not n=8, and to S25 if n=8, and 1 is added to the value m of m counter, then, returning, the operation transfers to the main routine shown in FIG. 8.

On the other hand, if the operated key is a touch key 3A, it is judged No. at S17, and the operation proceeds from S17 to s26. At S26, based on the data of the Zmn counter pointer, the value CNT of Zmn counter is judged to be CNT=1 or not, and the operation proceeds to S27 when CNT=1, and to S28 if not CNT=1.

At S27, the code data corresponding to the operated key ($m_m$, $n_n$) is read out from the code data table, and the code data is written into the key buffer, and the operation proceeds to S29. At S28, meanwhile, whether the value CNT of Zmn counter is CNT=2 to 5 or not is judged, and the operation goes back to S22 if no, that is, if CNT=0, and moves to S29 if yes. At S29, the value CNT of Zmn counter is set at CNT=2, and the operation proceeds to S23.

Incidentally, when the operation of key ($m_m$, $n_n$) is stopped, at S16 it is judged to be No, and the operation moves from S16 to S30.

S30 to S37 are steps for writing the OFF information, instead of the code data corresponding to the key ($m_m$, $n_n$) written into the key buffer. At S30, whether the key is touch key 3A or not is judged, and the operation proceeds to S31 if touch key 3A, and to S35 otherwise, that is, if stroke key 2A.

At S31, whether the value CNT of Zmn counter is CNT$\leq$2 or not is judged, and the operation proceeds to S34 if CNT$\leq$2, and to S32 if CNT$\leq$3 or more.

At S32, whether CNT=8 or not is judged, and if CNT=8, the operation proceeds to S33, and to S37 if not CNT=8, that is, if CNT=3 to 7.

At S33, the OFF information is written instead of the code data corresponding to the key ($m_m$, $n_n$) written in the key buffer. At the next S34, setting CNT=0, the operation goes back to S23.

When the key of which operation is stopped is not touch key 3A, that is, if it is stroke key 2A, the operation proceeds from S30 to S35, and whether the value CNT of Zmn counter is CNT$\leq$1 or not is judged, and the operation proceeds to S34 when CNT$\leq$1, and to S36 when CNT$\geq$2. At S36, whether CNT=5 or not is judged, and the operation proceeds to S33 when CNT=5, and to S37 if not CNT=5, that is, when CNT=2 to 4. At S37, 1 is added to the value CNT of Zmn counter, and the operation proceeds to S23.

Thus, by scanning from row $m_0$ of circuit matrix 4, sequentially from column $n_0$ to column $n_7$ while delivering scanning signals of L level to the output terminal Ym, the data are counted by the Zmn counter based on the signal level at input terminal Xn, and the ON action and OFF action of each key can be judged by the characteristics corresponding to the stroke key 2A and the touch key 3A.

Incidentally, in the input device D of this embodiment, the touch keys 3A to compose the function keys 3 are disposed in one area in the rear part of the keyboard 1, but they may be also disposed at the left side part or right side part, or both sides.

Meanwhile, in the above embodiment, all function keys 3 are composed of touch keys, but it is preferable to use stroke keys for tab key, back space key, paper feed key and other relatively frequently used function keys.

The input device D of this embodiment refers to an application into an electronic typewriter, and in this case, the CPU 16, ROM 17, and RAM 18 of the control unit may be shared with the control unit of the typewriter.

The structure of FPC board 5 and the structure of stroke keys 2A in this embodiment are only an example, and it is also possible to use existing flexible printed circuit boards and existing stroke keys.

The circuit matrix 4 is not necessarily required to be of 8 columns by 8 rows, but the circuit matrix may be freely set in relation with the number of keys and the layout.

In the flow chart shown in FIG. 9 (a), 9 (b) and 9 (c), it is designed to deliver a scan signal of L level to the output terminal Ym at S13 at every scan of each column of each row, but it is also possible to design to deliver a scan signal of L level with a width of, for example, 2 msec, to the output terminal Ym depending on the scanning duration from column $n_0$ to $n_7$.

The input device D of this invention may be applied, not only to an electronic typewriter, but also to various electronic appliances possessing character keys 2 and function keys 3, such as personal computer and word processor.

What is claimed is:

1. An input device comprising:
    a flexible printed circuit (FPC) board having a common circuit matrix with plural columns and plural rows of electric contacts;
    plurality of stoke keys and plurality of touch keys disposed on said common circuit matrix of said FPC board;
    key scan control means for key scanning while delivering scan signals sequentially in each row or each column of said circuit matrix;
    plurality of first counting means each of which corresponds to a respective stroke key for counting the results of key scanning effected by said key scan control means in a first specified mode for said respective stroke key;
    plurality of second counting means each of which corresponds to a respective touch key for counting the results of key scanning effected by said key scan control means in a second specified mode for said respective touch key;
    first judging means responsive to said first counting means for determining an ON action of respective stroke key when said respective first counting means has reached a first specified count number; and
    second judging means responsive to second counting means for determining an ON action of a touch key when said respective second counting means has reached a second specified count number greater than said first specified count number.

2. An input device according to claim 1, wherein each of said first counting means includes a hexadic counter for holding the value of 2 in the ON action of said stroke key, and each of said second counting means includes an enneadic counter for holding the value of 3 in the ON action of said touch key.

3. An input device according to claim 2, wherein said hexadic counter is reset when ON action signal is not received four times consecutively from said key scan control means, and said enneadic counter is reset when ON action signal is not received six times consecutively from said key scan control means.

4. An input device according to claim 1, wherein said flexible printed circuit board comprises an upper plastic film, lower plastic film, a spacer made of insulator inserted between both films, plural holes formed in said spacer, and printed circuits disposed on the under surface of said upper plastic film and the top surface of said lower plastic film, having electric contacts desposed respectively at each of said holes in said spacer.

5. An input device according to claim 1 further comprising:
    a plurality of character keys for inputting characters and symbols and a plurality of function keys for commanding various functions;
    said plurality of stroke keys being assembled corresponding to some of said electric contacts of said flexible printed circuit board, having an unactuated position and an actuated position displaced from said unactuated position, and composing said character keys; and
    said plurality of touch keys being disposed corresponding to electric contacts of said flexible printed circuit board other than said stroke keys' electric contacts, and comprising said function keys.

6. An input device according to claim 5, wherein said flexible printed circuit board comprises an upper plastic film, a lower plastic film, a spacer made of insulator inserted between both films, plural holes formed in said spacer, and printed circuits disposed on the under surface of said upper plastic film and the top surface of said lower plastic film, having electric contacts disposed respectively at each of said holes in said spacer.

7. An input device according to claim 5, wherein each of said stroke keys includes a key top, a key stem extending downward from said key top and a cap-shaped rubber contact member for generating tactile stroke in operation.

8. An input device according to claim 7, wherein a first portion of said flexible printed circuit board corresponding to said touch keys are in a first plane raised with respect to a second plane which includes a second portion of said flexible printed circuit board corresponding to said stroke keys, said key tops of said stroke keys at its unactuated position are in said first plane.

* * * * *